METHOD OF MAKING THERMOELECTRIC GENERATORS

Filed Jan. 23, 1962 2 Sheets-Sheet 1

INVENTORS
M. Bernard Marshall
Dennison H. MacDonald
BY
Spencer, Rockwell & Bartholow
ATTORNEYS INVENTORS
M. Bernard Marshall
Dennison H. MacDonald
BY
Spencer, Rockwell & Bartholow
ATTORNEYS 3,300,840

METHOD OF MAKING THERMOELECTRIC GENERATORS

Maurice Bernard Marshall, 1 Norwood Ave., Milford, Conn. 06460, and Dennison H. MacDonald, Park Ave., R.R. 3, Madison, Conn. 06443

Filed Jan. 23, 1962, Ser. No. 168,087
3 Claims. (Cl. 29—155.5)

This invention relates generally to thermoelectric devices and more particularly to methods for making thermopile elements having a large number of adjacent thermocouple elements in a relatively short length, and to novel thermoelectric generators utilizing these thermopile elements.

The thermoelectric effects caused by heating junctions of dissimilar metal conductors have been known for many years. In the 19th century, Seebeck reported that he had produced potential differences by heating the junction between dissimilar metal conductors. A few years later, Peltier discovered that the passage of electrical current through a junction resulted in the absorption or generation of heat at the junction depending upon the direction of current. Thomson investigated the relationship between the effects observed by Seebeck and Peltier and observed the heating or cooling effect in a homogeneous conductor when an electric current passes through the conductor in the direction of a temperature gradient along the conductor. In spite of the early discovery of the thermoelectric effects, their use has been generally limited to pyrometry applications, that is, measurement of temperature through the use of thermocouples. One reason for their restricted use is due mainly to the small currents generated by thermocouples. As a result, thermocouples have been used for measurement where it is desired to measure the variation in generated current and the amount of current generated is not critical.

As far as can be ascertained, Seebeck was the first to list metals in a thermoelectric series, in an effort to evaluate the relative efficiencies of thermocouple elements using various metal combinations. A thermocouple unit formed from dissimilar metals which are further apart in the thermoelectric series will generate a greater amount of current than a thermocouple unit formed from dissimilar metals which are more closely related in the thermoelectric series. The metals which form thermocouple junctions having the highest efficiency are unfortunately the more exotic metals and, therefore, the most expensive metals. Of course, the current generated in any thermocouple unit will be directly proportional to the temperature gradient between the hot and cold junction. Higher output may therefore be obtained by heating the hot junction to as high a temperature as possible while maintaining the cold junction at a relatively low temperature. The absolute temperature of either junction is not as important as the temperature difference between the two.

In order to increase the generated current, thermopile elements have been produced comprising a plurality of thermocouples in series. The first thermopile elements were made by twisting or welding together the ends of a plurality of dissimilar wires. While this formed a plurality of thermocouples in electrical series which could generate larger currents, these thermopile elements were expensive to produce and required long lengths to obtain a large number of thermocouples. In an effort to reduce costs, other techniques were developed whereby a base metal wire was coated with a dissimilar metal to form the junction. A method of dip plating on a portion of a wire coil is disclosed by Higley in U.S. Patent No. 2,310,026. In Patent No. 2,562,696 there is disclosed a vapor deposition method while Blanchard, in Patent No.

2,983,031 discloses a hot dip method. Patent No. 2,768,424 to Andrus discloses a method in which a coil of copper wire is dipped in molten zinc and then heated in an inert atmosphere to alloy the dipped portion. Partial plating of a wire coil is also disclosed in Patent No. 2,807,657 to Jenkins et al. and Patent No. 2,580,293 to Gier et al. During plating, Jenkins imbeds the coil in an insulator while Gier covers a small portion of the coil with tissue paper.

While all of these prior teachings effect the expected result, none of them are capable of producing a small device adapted to form part of an inexpensive generator, which can generate usable quantities of electricity from low energy heat sources, for example, enough energy to operate a transistor radio or the like from, say, a candle or kerosene burner.

Ideally, in order to effect the last-mentioned result and in order to economically produce the thermopile elements, the smallest possible wire should be used and the method for making the junctions should form as many as possible at one time. Furthermore, the method of making the junctions should be such as to allow the thermocouples to be as close as possible to one another without touching. The hot and cold junctions should be adequately separated to prevent excessive heat transfer between the junctions and the metals employed should be inexpensive and readily available.

Accordingly, it is an object of this invention to provide a method of making thermopile elements having a plurality of series-connected thermocouple elements in adjacent noncontacting relationship.

Another object of this invention is to provide a method of making a large number of series-connected dissimilar metal junctions disposed in adjacent noncontacting relationship.

A further object of this invention is to provide a method for inexpensively making component parts for a thermoelectric generator.

A still further object of this invention is to provide a method of making the largest possible number of dissimilar, noncontacting metal junctions in any given lineal distance.

Still another object of this invention is to provide a thermoelectric generator capable of generating usable quantities of electricity which may be constructed of inexpensively produced thermopiles having the largest possible number of thermocouple elements in any given distance.

Still other objects and advantages of the invention will in part be obvious and will in part be apparent from the specification.

Generally speaking, in accordance with the invention, thermopiles are produced by winding a coil of fine wire on a mandrel or support and coating approximately half of each coil, such as by plating, deposition or the like, to provide a plurality of adjacent noncontacting junctions of dissimilar metal on opposite sides of the coil. Thereafter, a plurality of the thermopile elements are mounted in series, parallel or series-parallel to produce a thermoelectric generator which may be operated by means of a common candle, kerosene lamp or a similar heat producing device to generate usable quantities of electricity such as may be required for the operation of a transistor radio and the like.

The invention accordingly comprises the several steps and the relation of one or more of such steps with respect to each of the others, and the articles possessing the features, properties, and the relation of elements which are exemplified in the following detailed disclosure, and the scope of the invention will be indicated in the claims.

For a fuller understanding of the invention, reference is had to the following description taken in connection with the accompanying drawings, in which:

FIG. 1 is a side elevational view of a thermopile element constructed in accordance with this invention;

FIG. 2*a* is a sectional view taken along line 2—2 of FIG. 1;

FIG. 2*b* is a sectional view of an alternate form of coil support that may be used to replace that shown in FIG. 2*a*;

FIG. 3*a* is a sectional view of a coil support with portions adapted to remain in the coil during use;

FIG. 3*b* is a sectional view of an alternate form of coil support for that shown in FIG. 3*a*;

Figure 1:
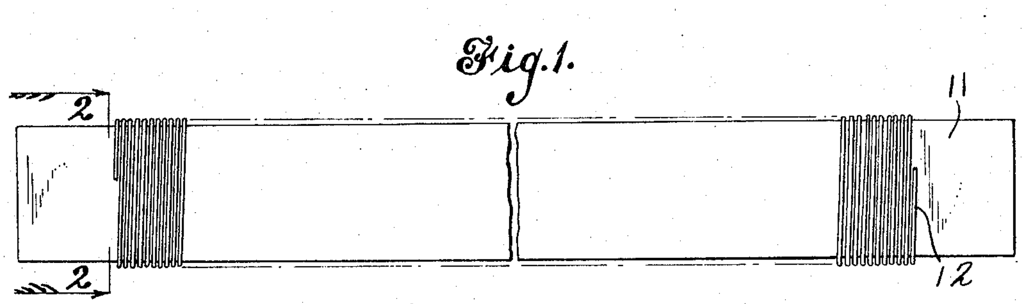
Figures 2A, 2B, 3A, 3B, 4:
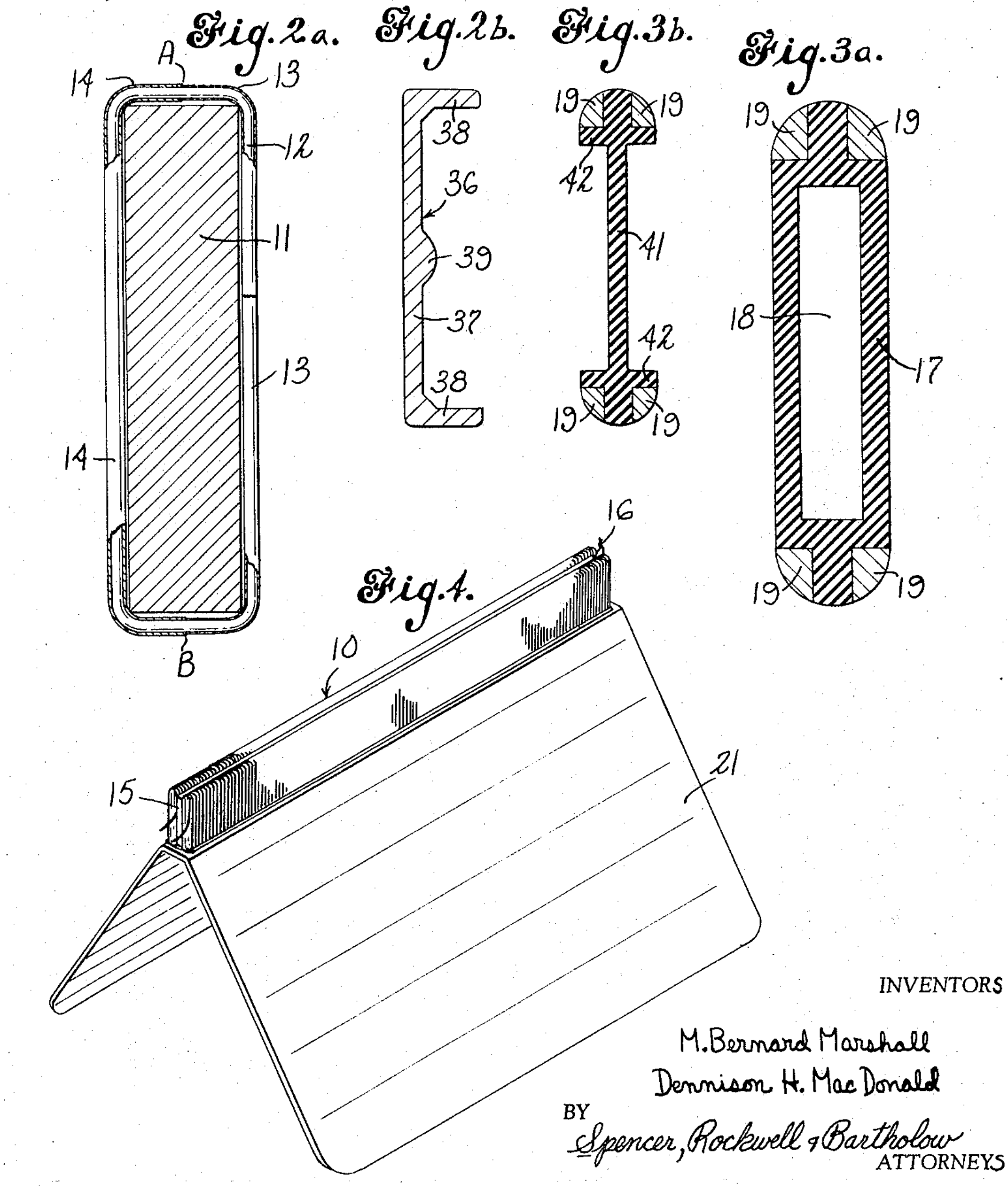
FIG. 4 is a perspective view showing thermopile elements connected to a heat dissipating element for use in a thermoelectric generator, according to this invention.

Referring now to FIGS. 1 and 2, a mandrel 11 of electrical conductive material such as aluminum or the like, is wound with a continuous helical coil of small gage wire 12, care being taken to maintain a separation between adjacent coils. Constantan wire having a .005" diameter has been used successfully and may be wound with, say, .0015" spacing between adjacent coils. Approximately half of the helical coil is coated with a plating resist 13 of any suitable material. The uncoated portions may be masked during the coating operation. Viewing the mandrel as an elongated rectangle as shown in FIG. 2*a*, the plating resist should preferably extend from approximately the center of one short side to approximately the center of the opposite short side. The mandrel is thereafter immersed in a plating solution of copper and a layer of copper 14 is electroplated on the exposed constantan. The conductive mandrel which provides a form on which the coils are wound also assures complete and even plating of all coils along the entire length of the mandrel. Without the conductive core, the voltage drop through the coil due to the resistance of the wire would cause excessive plating at one end and inadequate plating at the other end. It will readily be seen that the copper will coat the constantan wire on all portions not covered by the plating resist thereby forming a junction between the constantan and copper at points A and B in FIG. 2. Using a mandrel having a cross-sectional size of 1/16" by 3/8", it has been found that the wire can be wound to provide 144 turns per inch or 288 junctions per inch. In order to maintain separation of adjacent coils during coating and plating, it is desirable to provide the mandrel on the short sides with grooves for the wire. In the alternative, a filament such as glass or nylon or the like may be wound on the mandrel with the wire thereby maintaining separation of adjacent coils. If, at a later time, it is desired to remove the filament, it could be physically removed or dissolved or melted such as by the application of heat.

To impart mechanical strength to the unit prior to removal of the mandrel, two thermopile windings are cemented together with an insulator 15 therebetween, as shown in FIG. 4, to form a thermopile element 10. It is preferable for insulator 15 to be provided with serrations which match the windings of the spaced coils. By providing such a serrated insulator, the two thermopile windings could be placed on opposite sides of the insulator and held there by any suitable means such as by mechanical clamping thus assuring that the space between the coils is maintained. The unit is next placed in a caustic solution such as sodium hydroxide which completely dissolves the aluminum mandrels. One end of each coil is connected together as at 16 thereby placing the two thermopile windings in series. After cleaning, the thermopile elements are ready for mounting in thermoelectric generators. In this particular arrangement, if the thermopile element is 5" long, for example, the unit will contain approximately 1440 coils or 2880 junctions in this extremely short lineal distance.

A modified form of mandrel is shown in FIG. 2*b*. The mandrel 36 has a main portion 37 with two short portions 38, one extending perpendicularly from each end of the main portion. To impart increased strength to the main portion, it may be provided with a web 39. The material from which mandrel 36 is made would be the same as for mandrel 11 thereby permitting the mandrel to be completely removed by the caustic solution. Since mandrel 36 has a smaller cross-sectional area than mandrel 11, it uses less metal and therefore has a lower cost. The smaller quantity of metal also results in the mandrel being more quickly removed by the caustic solution to effect a further saving in the quantity of caustic solution required.

In order to give the helical coil greater strength, an alternate form of mandrel such as is shown in FIG. 3*a* may be used. The mandrel is composed mainly of an insulating material 17 which is provided with a hollow core 18. Such a mandrel, which is to remain inside the coil to lend support thereto, is provided with the hollow core to reduce the heat conductivity of the mandrel. The outer corners of the insulating material are provided with segments 19 of electrically conductive material which may be aluminum or other suitable conducting material that will contact the coils during plating to assure even plating. After the coil has been wound on the mandrel and plated, the coil and core may be placed, as before, in a bath to remove the conducting segments only, thereby leaving the insulating material within the coil to support the coil.

The coil support mandrel shown in FIG. 3*a* may also be constructed as shown in FIG. 3*b*. In this case, the insulating material 41 extends the full height of the mandrel and is provided with perpendicular arms 42 set in from each end and determining the width of the mandrel. As in FIG. 3*a*, electrically conductive segments 19 are provided in the four outer corners to assure even plating of the coils. The caustic bath will remove the conducting segments only, leaving the insulating segments to support the coil. If the outer edges of the insulating segments are provided with suitable serrations, the mandrel will also maintain coil separation.

Another completely removable mandrel may be made by using a wax core with strips of conducting material along the edges. After the coil has been plated and cemented to an insulator, the conducting material is removed with a caustic solution which also may be heated to melt out the wax.

The thermopile device composed of the individual thermocouple elements will operate in a well-known manner. The junctions along one edge of the coil will be placed adjacent a heat source, thereby making them the hot junctions, while the junctions on the opposite side of each coil will be the cold junctions. For any given pair of dissimilar metals, the electricity generated will be proportional to the temperature differential between the hot and the cold junctions. It is therefore desirable to maintain the cold junctions as cool as possible. For this reason, the thermopile element is attached to a cool-

What is claimed is:

1. A method of forming an internally supported thermopile element comprising the steps of winding upon a mandrel of non-conductive material provided with at least one longitudinally disposed electrically conductive portion a coil of wire having spaced turns, a segment of each coil turn making contact with the conductive portion of the mandrel, coating approximately one-half of each coil turn with a plating resist, electroplating a different metal from that of said conductive portion and said wire on the uncoated portions of each turn, and removing the conductive portion of the mandrel by means of a chemical solution to thereby provide internal permanent support to said coil by means of said mandrel.

2. A method of forming an internally and externally supported thermopile element comprising the steps of winding upon a mandrel of non-conductive material provided with at least one longitudinally disposed electrically conductive portion a coil of wire having spaced turns, a segment of each coil turn making contact with the conductive portion of the mandrel, coating approximately one-half of each coil turn with a plating resist, electroplating a different metal from that of said conductive portion and said wire on the uncoated portions of each turn, bonding an external portion of said coil to an insulated support along the entire length thereof, and removing the conductive portion of the mandrel by means of a chemical solution to thereby provide internal permanent support to said coil by means of said mandrel.

3. A method of forming an internally and externally supported thermopile element comprising winding upon a mandrel having a longitudinal electrically conductive portion, a helical coil of wire with adjacent turns in non-contacting relationship, coating a portion of each coil turn with a plating resist, electroplating a different metal from that of said conductive portion and said wire on the uncoated portions of each turn, winding upon a second like mandrel a second helical coil of wire with adjacent turns in non-contacting relation, coating a portion of each second coil turn with a resist, plating the uncoated portions of each of the second coil turns with said different metal, bonding said helical coil and said second helical coil on opposite sides of a strip of insulating material, placing the complete unit in a chemical solution which removes the conductive portions of the mandrels thereby providing permanent internal support to the unit by means of said mandrels, and electrically connecting said coils.

References Cited by the Examiner

UNITED STATES PATENTS

| | | | |
|---|---|---|---|
| 1,010,639 | 12/1911 | Kitchen | 204—297 |
| 2,023,603 | 12/1935 | Lodge | 204—15 |
| 2,058,525 | 10/1936 | Takanashi | 204—15 |
| 2,129,868 | 9/1938 | Peterson | 204—297 |
| 2,310,026 | 2/1943 | Higley | 136—4 |
| 2,349,946 | 5/1944 | Durr | 242—77 |
| 2,562,696 | 7/1951 | Canada | 136—4 |
| 2,580,293 | 12/1951 | Gier et al. | 29—155.57 X |
| 2,812,499 | 11/1957 | Robertson | 140—71.5 X |
| 2,849,350 | 8/1958 | Roach | 204—15 |
| 2,949,592 | 8/1960 | Smiley | 204—15 |
| 2,983,031 | 5/1961 | Blanchard | 29—155.5 |
| 3,008,882 | 11/1961 | Craig | 204—15 |
| 3,014,851 | 12/1961 | Bommerscheim | 204—15 |
| 3,082,500 | 3/1963 | Te Velde | 29—155.5 |
| 3,082,508 | 3/1963 | Te Velde | 204—15 |

JOHN F. CAMPBELL, *Primary Examiner.*

JOHN A. MACK, *Examiner.*

R. L. GOOCH, R. W. CHURCH, J. H. BARNEY, *Assistant Examiners.* ing fin 21 such as that shown in FIG. 4. The cooling fin may be of aluminum or other suitable thermal conducting material which will conduct away the heat from the cold junctions and radiate the heat to the atmosphere or other medium in which the thermopile may be operating. Of course, the coils must be electrically insulated from the cooling fin.

Since the wire coil itself also conducts heat and therefore tends to raise the temperature of the cold junctions by conduction from the hot junctions, it is desirable to maintain the conduction at as low a value as possible. A build-up in the diameter of the wire by plating increases the cross-sectional area thereof, thereby increasing the rate of conduction. It is therefore desirable to have the dissimilar metal plated on the base wire as thin as possible. However, since the base wire is continuous beneath the dissimilar metal, the base wire will shunt across the dissimilar metal thereby reducing the efficiency of the junction. For this reason the dissimilar metal must be plated in sufficient thickness to cause substantially all the current flowing through the coil to flow through the plated metal in the plated half of each coil. The dissimilar metal should preferably have a lower electrical resistance than the base metal to minimize the required thickness of plating required to obtain the path through the dissimilar metal. Otherwise, an electrical junction of dissimilar metals will not exist. Since the increase in thickness of the plated metal to form a low resistance path opposes reduced conduction, it is necessary to strike a proper balance between the two conditions.

Figure 5:
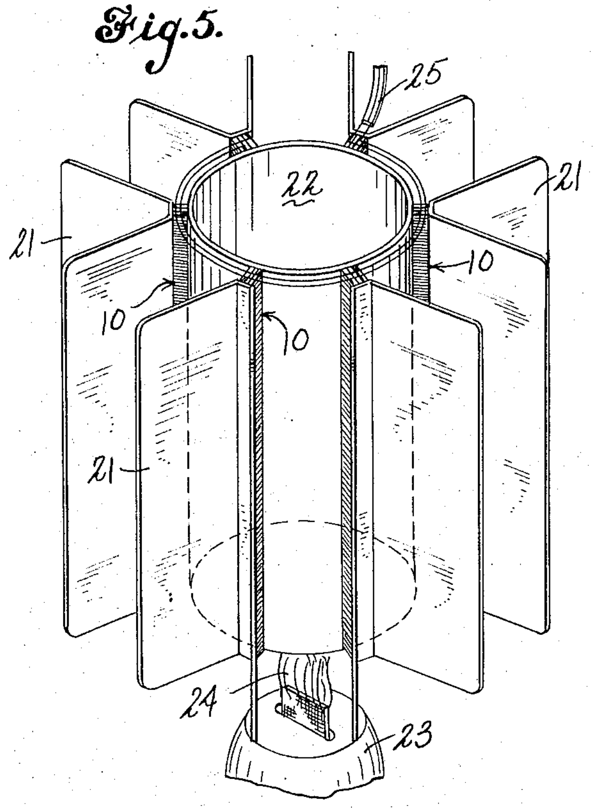
FIG. 5 is a perspective view of a thermoelectric generator constructed in accordance with the invention and utilizing the elements shown in FIG. 4.

To construct a thermoelectric generator, a plurality of thermopile elements 10 are attached around the circumference of a cylindrical member 22 as shown in FIG. 5, with the cooling fins pointing away from the center of the cylindrical member. The cylindrical member is mounted to a kerosene lamp 23 so that a flame 24 will heat the member. The thermopile elements may be connected together in series or in parallel, and the generated electricity will be taken off by leads 25. With the hot junctions of the thermopile elements contacting the cylindrical member and the cold junctions in contact with the cooling fins, a substantial temperature gradient between the hot and cold junctions will be maintained thereby generating electricity which may be measured across the leads and used to operate a load.

Figure 6:
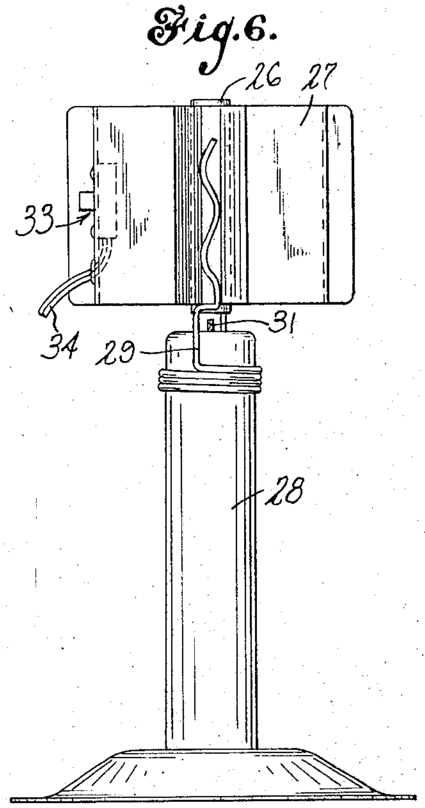
FIG. 6 is a side elevational view of an alternate form of thermoelectric generator utilizing a plurality of thermopile elements and an alternate heat dissipating element in accordance with the invention.
Figure 7:
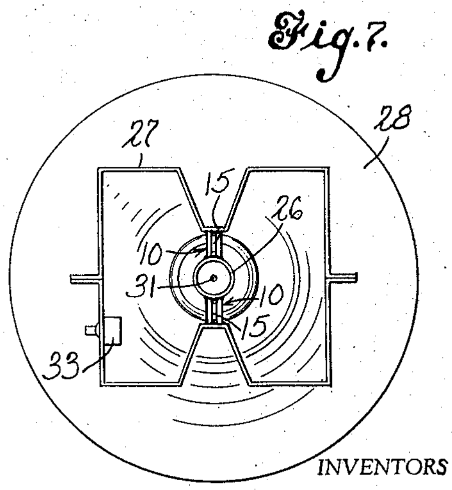
FIG. 7 is a top plan view of the thermoelectric generator shown in FIG. 6.

Referring now to FIGS. 6 and 7, an alternate thermoelectric generator is shown using two thermopile elements 10 attached to a cylindrical member 26. An envelope 27 of a suitable heat conducting and radiating material such as aluminum is formed as a closed unit to create a chimney effect, with portions thereof in contact with the junctions opposite to those contacting cylindrical member 26. The junctions in contact with the cylindrical member will be the hot junctions and those in contact with envelope 27 will be the cold junctions. The envelope is adapted to draw off heat from the cold junctions so that a substantial temperature gradient will be maintained. The envelope configuration creates a chimney effect and provides an increase in convection currents over those developed using radiators such as the cooling fins 21 shown in FIG. 4. The envelope is mounted to a candle holder 28 by means of a suitable clip 29 and a candle is disposed in the candle holder with its wick 31 extending above the candle holder. The heat from the candle flame will heat cylindrical member 26 thereby raising the temperature of the hot junctions while the envelope will maintain the temperature of the cold junctions at a substantially lower temperature. Using a common plumber's candle, it has been found that a thermoelectric generator such as that shown in FIGS. 6 and 7 will maintain approximately a 400° F. temperature gradient between the hot and cold junctions when the generator is placed in air at normal room temperatures.

The thermoelectric generator shown in FIGS. 6 and 7 will consist of approximately 1728 hot junctions of copper-constantan and 1728 cold junctions of constantan-copper and, with the temperature gradient indicated, a voltage of approximately 8½ volts will be generated when the thermopile elements are connected in series and approximately 4¼ volts when they are connected in parallel. It can thus be seen that this simple, economical device can be used to operate a transistorized portable radio and any number of these devices can be connected together to operate radio receivers or transmitters having greater power requirements. In a like manner, large geneators may also be constucted.

Figure 8:
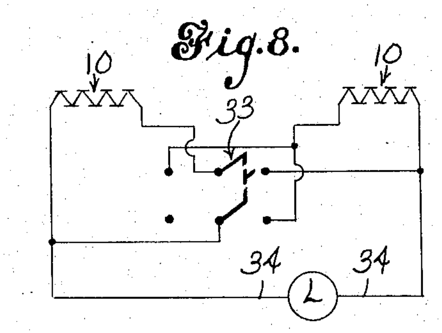
FIG. 8 is a schematic wiring diagram of a suggested circuit for connection of the thermoelectric generator shown in FIGS. 6 and 7 to a load.

The thermopile elements 10 in the generator may be wired as shown in FIG. 8 for series or parallel connection to a load. A switch 33 is attached to envelope 27 and is wired to the thermopile elements as shown in FIG. 8 with leads 34 connected to a load L. It will be readily seen in FIG. 8 that if switch 33 is closed to the left, the thermopile elements 10 will be connected in series; if switch 33 is thrown to the right, they will be connected in parallel.

Figure 9:
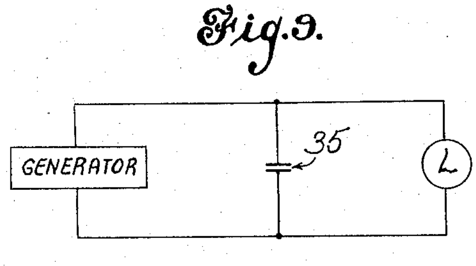
FIG. 9 is a schematic diagram of a circuit for using a thermoelectric generator to operate a load having varying power requirements which may, at times, exceed the output of the thermoelectric generator.

In the event that the power requirements of load L vary, and, at times, exceed the power output of the thermoelectric generator, a circuit such as shown in FIG. 9 may be utilized for connection to such a load. A capacitor 35 is connected in parallel with the thermoelectric generator to store energy when the load requirements fall below the continuous output of the thermoelectric generator. When the load exceeds the output of the generator, the capacitor will discharge through the load to supply the additional required power.

It should be understood that thermopile elements may be made by the method described herein using any of the dissimilar metals listed in the thermoelectric series, known in the art. Copper on a constantan base was described by way of example due to its adequate thermoelectric separation while still being readily available, relatively inexpensive and adequate for the purpose suggested above. It will be clear to those skilled in the art that the more exotic metals which are further apart in the thermoelectric series may be used to greatly increase the efficiency of the thermoelectric generator. Furthermore, for extremely high temperature applications, it would be desirable to use metals having superior high temperature qualities.

It is also to be understood that thermopile elements produced by this method have uses other than in thermoelectric generators. For example, if five of the basic thermopile units were connected in series, 7200 pairs of junctions would be provided. Since each copper-constantan junction will generate approximately .000011 volt per degree temperature difference, an instrument that could measure one microvolt could detect temperature differences as small as 1/72000° F. Such a system could sense the presence of a human being at a considerable distance. Fire detection systems eliminating the requirement of outside power supplies could also be easily constructed. Other possible uses of these highly accurate thermopile units are in calorimeters anemometers, radiation detectors, etc.

It will thus be seen that the objects set forth above, among those made apparent from the preceding description, are efficiently attained and, since certain changes may be made in carrying out the above method and in the constructions set forth, without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.